US 6,440,639 B1

United States Patent
Fontana, Jr. et al.

(10) Patent No.: US 6,440,639 B1
(45) Date of Patent: Aug. 27, 2002

(54) HIGH-ASPECT RATIO RESIST DEVELOPMENT USING SAFE-SOLVENT MIXTURES OF ALCOHOL AND WATER

(75) Inventors: Robert E. Fontana, Jr.; Jordan A. Katine, both of San Jose, CA (US); Ernst Kratschmer, Yorktown Heights; Michael J. Rooks, Briarcliff Manor, both of NY (US); Ching H. Tsang, Sunnyvale, CA (US); Raman Gobichettipalayam Viswanathan, Briarcliff Manor, NY (US)

(73) Assignee: International Business Machines Corporation, Armonk, NY (US)

(*) Notice: Subject to any disclaimer, the term of this patent is extended or adjusted under 35 U.S.C. 154(b) by 36 days.

(21) Appl. No.: 09/672,187

(22) Filed: Sep. 28, 2000

(51) Int. Cl.$^7$ .............................. G03C 5/16; G03C 5/56
(52) U.S. Cl. ..................... 430/313; 430/314; 430/323; 430/324; 430/329; 430/270.1
(58) Field of Search ................. 430/314, 323, 430/324, 329, 270.1, 313

(56) References Cited

U.S. PATENT DOCUMENTS

| 4,393,129 | A | | 7/1983 | Glashauser et al. | 430/296 |
| 5,879,859 | A | * | 3/1999 | Buchwalter et al. | 430/280.1 |
| 6,280,908 | B1 | * | 8/2001 | Aviram et al. | 430/314 |
| 6,319,656 | B1 | * | 11/2001 | Kikkawa et al. | 430/325 |

OTHER PUBLICATIONS

"Method for Making Vertical Electroplating Masks", IBM Technical Disclosure Bulletin, (Jul. 1986).
H. Watanabe, et al., "Thermodynamics of Development Process of Positive Resists in Binary Mixed Developer", Kyoto Research Laboratory, Matsushita Electronics Corporation, vol. 29, No. 12, pp. 2875–2878, Dec. 1990.

* cited by examiner

Primary Examiner—John A. McPherson
Assistant Examiner—Daborah Chacko-Davis
(74) Attorney, Agent, or Firm—Scully, Scott, Murphy & Presser; Manny W. Schecter

(57) ABSTRACT

A high-aspect ratio resist profile is obtained using a development process wherein a mixture of an alcohol and water is used as the developer. The alcohol/water mixture is non-toxic, and does not cause excess swelling and cracking of the resist during the development process.

10 Claims, 2 Drawing Sheets

US 6,440,639 B1

HIGH-ASPECT RATIO RESIST DEVELOPMENT USING SAFE-SOLVENT MIXTURES OF ALCOHOL AND WATER

FIELD OF THE INVENTION

The present invention relates to lithography, and more particular to a process for developing high-aspect ratio resist profiles using a developer which includes no toxic chemicals.

BACKGROUND OF THE INVENTION

In the field of semiconductor and magnetic device manufacturing, lithography is generally used to provide a pattern to a substrate needing patterning. Typically, the substrate is patterned by steps which include: applying a resist, exposing the resist to an energy source, developing the patterned resist using a suitable resist developer so as to expose a portion of the underlying substrate, and optionally, etching the exposed surface of the substrate by reactive-ion etching (RIE) or other suitable dry etching processes. The processing steps including resist application, exposure and development are referred to as "lithography". Although various resist profiles are known, high-aspect ratio resist profiles are typically used in fabricating masks, field effect transistors (FETs), micro-electrochemical systems (MEMS) and thin-film heads for magnetic disks. High-aspect ratio profiles are most notable for thin film heads because the writing yoke for the thin-film heads requires a tall, narrow metal line which is normally plated through a resist pattern. The term "high-aspect ratio" as used herein denotes a resist profile whose depth to width ratio is greater than 5.

In the prior art, numerous solvents or solvent systems comprising one or more organic compounds have been described which are capable of developing high-aspect ratio resist profiles in non-aqueous developable, polymeric resists, i.e., solvent developable resists. The prior art developers are typically composed of one or more toxic, e.g., carcinogenic or mutagenic, chemicals such as methylisobutylketone (MIBK), morpholine, toluene, chlorobenzene and butoxyethoxyethanol.

In addition to being toxic, prior art resist developers may cause excess resist swelling. Excess resist swelling during resist development is undesirable since it causes narrow lines to close at the resist surface, e.g., a pinch-off phenomenon occurs. A second problem caused by excess resist swelling during resist development is resist cracking. That is, solvent entering the resist will expand the volume of the resist film; however, the film must remain firmly adhered to the substrate. Stress relief caused by this swelling commonly occurs through cracking of the film, usually at the corners of the pattern.

In view of the drawbacks mentioned above in regard to prior art resist developers, there is a continued need for providing a new and improved resist developer that is does not cause excess swelling of the resist, does not cause any substantial cracking of the resist during resist development, yet is capable of developing high-aspect ratio profiles in non-aqueous developable resists.

SUMMARY OF THE INVENTION

One object of the present invention is to provide a method of fabricating high-aspect ratio profiles in nonaqueous developable, polymeric resists.

Another object of the present invention is to provide a method of fabricating high-aspect ratio resist profiles wherein the resist developer solution is non-toxic, i.e., non-carcinogenic or non-mutagenic.

A further object of the present invention is to provide a method of fabricating high-aspect ratio resist profiles in which the resist developer does not cause excess resist swelling and cracking during resist development.

A yet further object of the present invention is to provide high-aspect ratio resist profiles for fabricating masks, FETs, MEMS and thin film heads for magnetic disks.

These and other objects and advantages are obtained in the present invention by utilizing a resist developer which includes an alcohol/water mixture. Specifically, the method of the present invention comprises the steps of:

(a) applying a non-aqueous developable, polymeric resist to a surface of a substrate needing patterning;
(b) forming a high-aspect ratio pattern in said nonaqueous developable, polymeric resist by exposing the same to an energy beam; and
(c) developing the high-aspect ratio pattern in said nonaqueous developable, polymeric resist using an alcohol/water mixture.

In one embodiment of the present invention, the high-aspect ratio pattern is then transferred to the substrate by utilizing a conventional etching process such as RIE and numerous materials such as dielectrics, conductors and magnetic materials may be formed in the patterned region of the substrate and thereafter the non-aqueous developable, polymeric resist is stripped utilizing a conventional stripping process.

In another embodiment of the present invention, the developed resist containing the high-aspect ratio resist pattern is used as a plating mask wherein various materials can be formed therein.

DETAILED DESCRIPTION OF THE INVENTION

Figure 1:
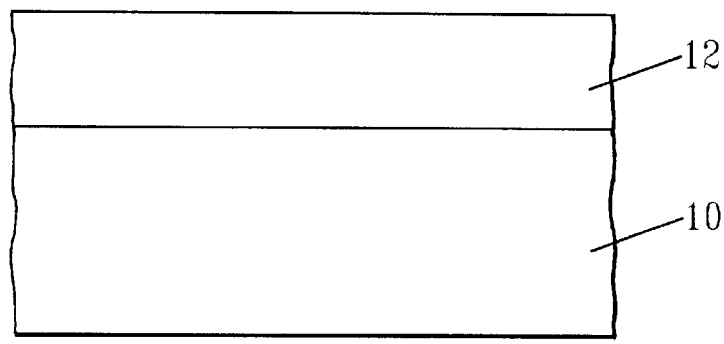
FIGS. 1–3 are pictorial views illustrating the basic processing steps of the present invention.

The present invention which provides a non-toxic development process for fabricating high-aspect ratio resist profiles in non-aqueous developable, polymeric resists will now be described in more detail by referring to the drawings that accompany the present application. It should be noted that like and/or corresponding materials are referred to in the drawings by like reference numerals.

Reference is first made to FIG. 1 which shows a basic structure that includes substrate 10 and non-aqueous developable, polymeric resist 12 formed on a surface thereof. The resist is formed on the surface of the substrate by utilizing any conventional deposition process well known in the art including, but not limited to: spin-on coating, dip coating, brushing, evaporation, chemical solution dissolution, chemical vapor deposition (CVD), plasma-assisted CVD and other like deposition processes. The thickness of the resist is not critical to the present invention, but typically the resist has a final deposited thickness of from about 100 to about 40,000 Å.

The term "substrate" is used herein to denote any layer (or layers) of a semiconductor or magnetic device which is capable of being patterned by lithography. Suitable layers include, but are not limited to: semiconducting substrates such as Si, Ge, SiGe, GaAs, InAs, InP and other III/V semiconductor compounds; layered semiconductors such as Si/SiGe; silicon-on insulators (SOIs); dielectric layers such as $SiO_2$, polyimides, etc.; metallic layers that include at least one conductive metal such as W, Pt, Au, Ag, Cu, etc; magnetic materials such as NiFe; and other like substrates that are capable of being patterned by lithography.

The term "non-aqueous developable, polymeric resist" denotes any polymeric resist that is solvent developable. Illustrative examples of such polymeric resists include, but are not limited to: polymers or copolymers of polymethyl-methacrylate (PMMA), polyacrylic acid, polystyrene, polyhydroxystyrene, chloromethacrylate, methylstyrene and other like polymeric compounds that are capable of being developed by an organic solvent. Combinations of one or more of the aforementioned polymers or copolymers are also contemplated herein. Of the various resists mentioned above, those including PMMA are particularly preferred herein.

Figure 2:
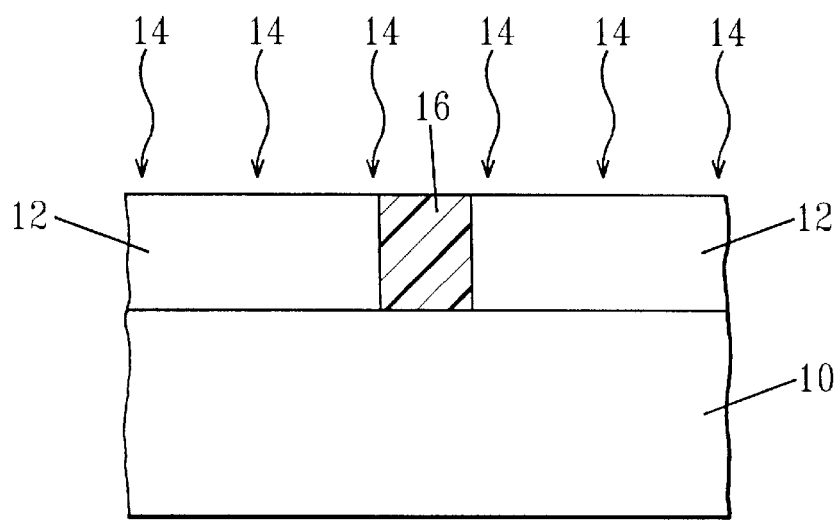

FIG. 2 of the present invention illustrates the step of exposing the non-aqueous developable, polymeric resist to energy beams 14 so as to form a high-aspect ratio pattern in the resist. Cross-hatched area 16 denotes the patterned area provided by this step of the present invention.

The exposure step employed in the present invention includes the use of any energy such as deep-UV (157,193 nm), X-ray, or e-beam which is capable of tracing out the high-aspect ratio resist pattern in a non-aqueous developable, polymeric resist.

Figure 3:
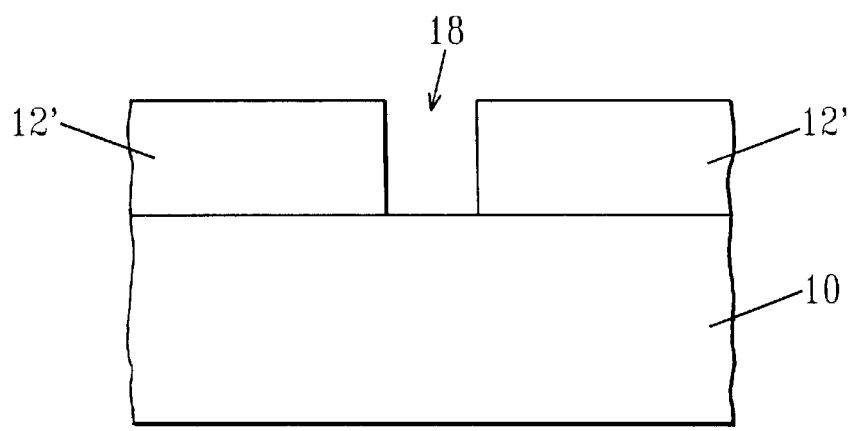

FIG. 3 shows the structure after applying the inventive developer solution of the present invention to the structure shown in FIG. 2. Specifically, the structure shown in FIG. 3 includes substrate 10, patterned nonaqueous developable, polymeric resist 12' and trench 18 in which a portion of the underlying substrate is exposed.

In accordance with the present invention, the exposed non-aqueous developable, polymeric resist is developed utilizing a non-toxic solvent mixture which includes at least one alcohol and water. Specifically, the at least one alcohol includes alkanols having the formula ROH wherein R is a $C_{1-12}$, preferably $C_{1-15}$, straight chain or branched alkyl. Illustrative examples of suitable alcohols include, but are not limited to: methanol, ethanol, propanol, isopropanal, butanol, isobutanol, pentanol and other like alkanols that have the formula mentioned above. A highly preferred alcohol employed in the present invention is isopropanol.

The inventive developer which does not include any toxic chemicals comprises a ratio of alcohol to water of from about 1:10 to about 10:1, with a ratio of from about 1:3 to about 3:1 being more highly preferred.

It should be noted that the use of isopropanol (IPA) alone provides low-stress dissolution of exposed resist, but is too weak a solvent to penetrate the resist fully. Applicants have unexpectedly determined that when IPA or other like alkanol is used in conjunction with water improved dissolution of the exposed resist results.

Without wishing to be bound by any theory, applicants believe that the water penetrates the resist, swelling the resist enough to allow exposed resist fragments to dissolve in the IPA. Another way to describe the above effect is that water provides thermodynamic matching of the alcohol to the resist.

The development step of the present invention may be conducted between 0° and 100° C.

Although the invention has been described in reference to the basic process steps described above and depicted in FIGS. 1–3, the present invention works well when other conventional lithography steps including prebaking are employed. As known to those skilled in the art, a prebaking step may occur prior to resist exposure by exposing the structure shown in FIG. 1 to an evaluated temperature which is capable of removing any excess solvent that may be present in the resist. Temperatures from about 50° to about 180° C. are typically used in a conventional prebake step.

In one embodiment of the present invention and following the development of the high-aspect ratio resist profile, the pattern is then transferred to the substrate by utilizing a conventional etching process such as RIE, ion-beam etching or plasma-etching; and thereafter numerous materials 20 such as dielectrics; conductive materials, e.g., conductive metals, metallic silicides, or polysilicon; or magnetic films such as NiFe, may be formed in the patterned region of the substrate by conventional means such as chemical vapor deposition (CVD), plasma-assisted CVD, sputtering, plating, evaporation and other like deposition processes. Following these steps, the patterned, non-aqueous developable, polymeric resist is then stripped utilizing a conventional stripping process well known to those skilled in the art. The final structure obtained in this embodiment is shown in FIG. 4.

Figure 4:
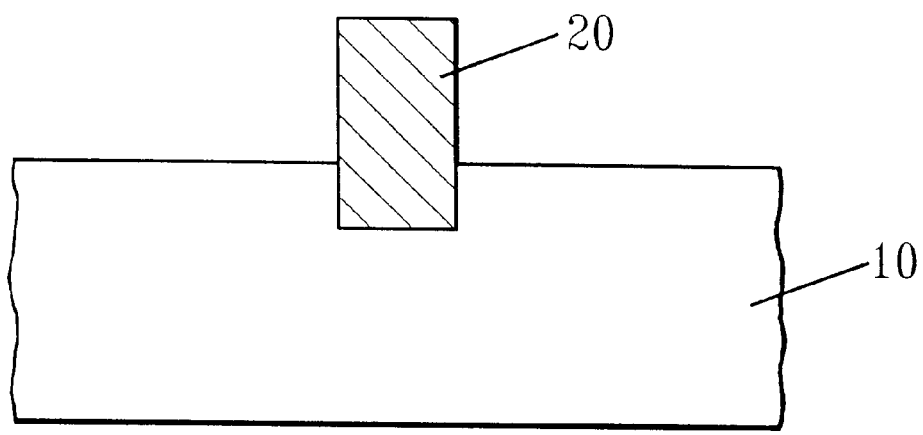
FIG. 4 is a pictorial view of a final structure after etching is used to transfer the resist pattern to the and the patterned substrate is filled with a desired material.

Alternatively, a conventional planarization process such as chemical-mechanical polishing (CMP) may be employed on the structure shown in FIG. 4 so as to obtain a structure wherein the top of region 20 is coplanar with the top of substrate 10.

Figure 5:
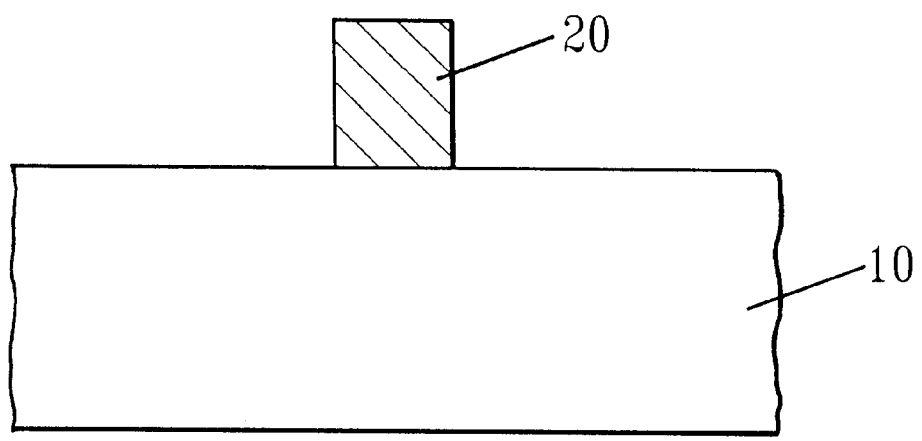
FIG. 5 is a pictorial view of another final structure wherein the patterned resist is used as a plating mask.

In another embodiment of the present invention, a dielectric, conductive or magnetic material 20 is formed in the trench and thereafter the patterned resist is stripped providing the structure shown in FIG. 5.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the letters patent is:

1. A method of providing a high-aspect ratio resist profile to a resist comprising the steps of:
   (a) applying a non-aqueous developable, polymeric resist to a surface of a substrate needing patterning;
   (b) forming a high-aspect ratio profile pattern in said non-aqueous developable, polymeric resist by exposing the same to an energy beam, wherein said high-aspect ratio profile pattern has a depth to width ratio of 5 or greater; and
   (c) developing the high-aspect ratio profile pattern m said non-aqueous developable, polymeric resist using an alcohol/water mixture.

2. The method of claim 1 wherein said non-aqueous developable, polymeric resist is applied by spin-on coating, dip coating, brushing, evaporation, chemical solution dissolution, chemical vapor deposition (CVD) or plasma-assisted CVD.

3. The method of claim 1 wherein said non-aqueous developable, polymeric resist is polymethylmethacrylate, polystyrene, polyhydroxystyrene, polyacrylic acid, chloromethacrylate, methylstyrene or copolymers and combinations thereof.

4. The method of claim 1 wherein step (b) includes e-beam exposure, X-ray exposure or deep-UV exposure.

5. The method of claim 1 wherein said alcohol is an alkanol having the formula ROH wherein R is a $C_{1-12}$ straight chain or branched alkyl.

6. The method of claim 5 wherein said alkanol is methanol, ethanol, propanol, isopropanol, butanol, isobutanol or pentanol.

7. The method of claim 1 wherein said alcohol and water are used in a ratio of from about 1:10 to about 10:1.

8. T-he method of claim 7 wherein said ratio of alcohol to water is from about 1:3 to about 3:1.

9. The method of claim 1 further comprising etching through said developed resist into said substrate and depositing a material in said etched area.

10. The method of claim 1 further comprising depositing a material into said developed area of said resist and stripping said resist.

* * * * *

UNITED STATES PATENT AND TRADEMARK OFFICE
CERTIFICATE OF CORRECTION

PATENT NO.   : 6,440,639 B1
DATED        : August 27, 2002
INVENTOR(S)  : R. Fontana, Jr. et al.

It is certified that error appears in the above-identified patent and that said Letters Patent is hereby corrected as shown below:

Column 1,
Line 23, "Although" should begin new paragraph.

Column 2,
Line 40, "to the and the" should read -- to the substrate and the --

Column 4,
Line 63, "of 5" should read -- of about 5 --
Line 65, "pattern m" should read -- pattern in --

Column 6,
Line 7, "T-he" should read -- The --

Signed and Sealed this

Twenty-ninth Day of April, 2003

JAMES E. ROGAN
*Director of the United States Patent and Trademark Office*